United States Patent [19]
Takahashi

[11] Patent Number: 6,069,826
[45] Date of Patent: May 30, 2000

[54] METHOD OF REWRITING IN NONVOLATILE SEMICONDUCTOR MEMORY DEVICE

[75] Inventor: Keita Takahashi, Nara, Japan

[73] Assignee: Matsushita Electronics Corporation, Osaka, Japan

[21] Appl. No.: 09/150,918

[22] Filed: Sep. 10, 1998

[30] Foreign Application Priority Data

Sep. 17, 1997 [JP] Japan .................................... 9-252423

[51] Int. Cl.⁷ ................................................ G11C 16/04
[52] U.S. Cl. ........................ 365/185.28; 365/185.29; 365/185.18; 365/185.14; 365/185.01
[58] Field of Search ..................... 365/185.11, 185.01, 365/185.17, 185.28, 185.29, 185.14, 185.18

[56] References Cited

U.S. PATENT DOCUMENTS

| | | | |
|---|---|---|---|
| Re. 35,838 | 7/1998 | Momodomi et al. ............ | 365/185.17 |
| 5,057,448 | 10/1991 | Kuroda ..................... | 437/52 |
| 5,514,896 | 5/1996 | Tsunoda .................... | 257/391 |
| 5,555,204 | 9/1996 | Endoh et al. ............... | 365/185.17 |
| 5,657,271 | 8/1997 | Mori ...................... | 365/185.27 |
| 5,747,849 | 5/1998 | Kuroda et al. ............. | 257/321 |
| 5,877,524 | 3/1999 | Oonakado et al. ........... | 257/321 |
| 5,889,304 | 3/1999 | Watanabe et al. ........... | 257/321 |

OTHER PUBLICATIONS

IDEM 94–921, H. Kume et al, IEEE Technical Dig. of IEDM, pp. 992, 1992.

*Primary Examiner*—Viet Q. Nguyen
*Attorney, Agent, or Firm*—Smith, Gambrell & Russell, LLP

[57] ABSTRACT

A P-type well 4 is set to an externally supplied ground potential. An N-type well 3 and a P-type well 5 are set to 3.3 V. A control gate electrode 14 is set to −6.5 V. A drain 10 is set to 6.5 V. A source 9 is set to 3.3 V or opened. Thus, a difference is 13 V between the control gate electrode 14 and the drain 10. A sufficient amount of tunnel current is generated between the drain 10 and a floating gate electrode 12. In this manner, the P-type well 5 is set to a positive voltage with respect to the externally supplied ground potential, whereby it is possible to reduce an absolute value of a negative voltage applied to the control gate electrode 14 and also to reduce a potential difference between the drain 10 and the P-type well 5. Thus, a memory transistor can be finely formed, have high reliability and have a low threshold voltage.

3 Claims, 2 Drawing Sheets

| | WRITE | ERASE | READ |
|---|---|---|---|
| first P-type well | 0 V | 0 V | 0 V |
| N-type well | 3.3 V | 0 V | 0 V |
| second P-type well | 3.3 V | −6.5 V | 0 V |
| control gate electrode | −6.5 V | 6.5 V | 3.3 V |
| drain | 6.5 V | Open | 1.0 V |
| source | 3.3 V orOpen | −6.5 V | 0 V |

|  | WRITE | ERASE | READ |
|---|---|---|---|
| first P-type well | 0 V | 0 V | 0 V |
| N-type well | 3.3 V | 0 V | 0 V |
| second P-type well | 3.3 V | -6.5 V | 0 V |
| control gate electrode | -6.5 V | 6.5 V | 3.3 V |
| drain | 6.5 V | Open | 1.0 V |
| source | 3.3 V orOpen | -6.5 V | 0 V |

Fig. 3

|  | WRITE | ERASE | READ |
|---|---|---|---|
| first P-type well | 0 V | 0 V | 0 V |
| N-type well | 0 V | 0 V | 0 V |
| second P-type well | 0 V | −6.5 V | 0 V |
| control gate electrode | −8.5 V | 6.5 V | 3.3 V |
| drain | 4.5 V | Open | 1.0 V |
| source | 0 V orOpen | −6.5 V | 0 V |

METHOD OF REWRITING IN NONVOLATILE SEMICONDUCTOR MEMORY DEVICE

BACKGROUND OF THE INVENTION

1. Field of the Invention

The present invention relates to a method of rewriting in a nonvolatile semiconductor memory device, more particularly, a floating gate electrode type nonvolatile semiconductor memory device having a two-layer gate electrode constituted of a floating gate electrode and a control gate electrode.

2. Description of the Related Art

An inexpensive large-capacity nonvolatile semiconductor memory device has been recently used. A wide provision of such a nonvolatile semiconductor memory device requires a rewriting method which is adapted so that it can finely form the above-described memory and can improve the reliability thereof.

An example of the conventional rewriting method in the nonvolatile semiconductor memory device will be described below with reference to FIGS. 2 and 3.

FIG. 2 is a cross sectional view of a floating gate electrode type nonvolatile semiconductor memory device. In FIG. 2, numeral 1 denotes an isolation. Numeral 2 denotes a P-type semiconductor substrate. Numeral 3 denotes an N-type well. Numeral 4 denotes a first P-type well. Numeral 5 denotes a second P-type well. Numeral 6 denotes a first P-type diffusion layer. Numeral 7 denotes an N-type diffusion layer. Numeral 8 denotes a second P-type diffusion layer. Numeral 9 denotes a source. Numeral 10 denotes a drain. Numeral 11 denotes a gate insulation film. Numeral 12 denotes a floating gate electrode. Numeral 13 denotes an interlaminar insulation film. Numeral 14 denotes a control gate electrode.

As shown in the drawing, a memory cell has the floating gate electrode 12 which is electrically insulated by the gate insulation film 11 and the interlaminar insulation film 13. In this drawing, the gate insulation film 11 has such a film thickness that a tunnel current can flow on at least a region belonging to the source 9 or the drain 10. The potential of the second P-type well 5, in which the memory cell is arranged, is controlled by the voltage applied to the second P-type diffusion layer 8. The potential of the N-type well 3 is controlled by the voltage applied to the N-type diffusion layer 7. The potentials of the P-type semiconductor substrate 2 and the first P-type well 4 are typically set to a ground potential by the voltage applied to the first P-type diffusion layer 6. The second P-type well 5, in which the memory cell is arranged, is covered with the N-type well 3 so that it is electrically isolated from the P-type semiconductor substrate 2 and the first P-type well 4. Thus, the second P-type well 5 can be controlled so that it may be set to potentials other than the ground potential.

FIG. 3 shows the conventional rewriting method. In this drawing, there are shown voltage conditions for elements in the operations of the memory cell, i.e., in write, erase and read operations. That is, FIG. 3 shows the voltage conditions for the first P-type well 4, the N-type well 3, the second P-type well 5, the control gate electrode 14, the drain 10 and the source 9 in these operations.

First, the write operation will be described. Herein, the write is defined as the operation described below. That is, electrons in the floating gate electrode 12 are ejected from the drain 10 by the tunnel current so as to thereby reduce a threshold voltage of the memory cell.

As shown in the drawing, the voltages of the first P-type well 4, the N-type well 3 and the second P-type well 5 are set to 0 V (the ground potential). The voltage of the control gate electrode 14 is set to −8.5 V. The voltage of the drain 10 is set to 4.5 V. The voltage of the source 9 is set to 0 V or opened. In accordance with the above voltage conditions, a potential difference is 13 V between the control gate electrode 14 and the drain 10 and also, a predetermined amount of tunnel current is generated between the drain 10 and the floating gate electrode 12.

Next, the erase operation will be described. Herein, the erase is defined as the operation described below. That is, the electrons are injected from the second P-type well 5 into the floating gate electrode 12 by the tunnel current so as to thereby increase the threshold voltage of the memory cell.

As shown in the drawing, the voltages of the first P-type well 4 and the N-type well 3 are set to 0 V (the ground potential). The voltage of the second P-type well 5 is set to −6.5 V. The voltage of the control gate electrode 14 is set to 6.5 V. The voltage of the drain 10 is opened. The voltage of the source 9 is set to −6.5 V. In accordance with the above voltage conditions, the potential difference is 13 V between the control gate electrode 14 and the second P-type well 5. A predetermined amount of tunnel current is generated between the second P-type well 5 and the floating gate electrode 12.

Next, the read operation will be described. The read is determined in accordance with an amount of drain current through the memory cell.

As shown in FIG. 3, the voltages of the first P-type well 4, the N-type well 3 and the second P-type well 5 are set to 0 V (the externally supplied ground potential). The voltage of the control gate electrode 14 is set to 3.3 V. The voltage of the drain 10 is set to 1.0 V. The voltage of the source 9 is set to 0 V. Under the above voltage conditions, whether the memory cell is in a write state or an erase state is determined in accordance with the amount of drain current through the memory cell. That is, the low threshold voltage of the memory cell indicates that the memory cell is in the write state, while the high threshold voltage indicates that the memory cell is in the erase state. Thus, when the memory cell is in the write state, the amount of drain current is more than the amount of drain current in the erase state.

However, the above-described conventional rewriting method has three problems. Firstly, a negative voltage applied to a control gate during writing has a high absolute value. Thus, a highly voltage-resistant transistor for driving the control gate cannot be reduced in size. Therefore, it is difficult to finely form the semiconductor memory device.

Secondly, for improving the reliability of the memory cell, it is necessary to thicken the gate insulation film of the memory cell or to reduce the drain voltage during writing. However, these methods cause the amount of tunnel current to be reduced. Thus, for compensating this reduction in the amount of current, it is necessary to set the absolute value of the negative voltage applied to the control gate during writing to the still higher value. It is again difficult to reduce the size of the highly voltage-resistant transistor for driving the control gate. It is also difficult to improve the reliability.

Thirdly, when the memory cell is reduced in dimension or when the threshold voltage of the memory cell is reduced so as to realize a low voltage operation, during writing, it is necessary to reduce the potential difference between the drain voltage and the P-type well in which the memory cell is arranged. However, this method causes the amount of tunnel current to be reduced. Thus, it is necessary to compensate the reduced amount of current by setting the absolute value of the negative voltage applied to the control gate during writing to the still higher value. It is thus difficult to finely form the semiconductor memory device and to improve a low voltage operation performance.

SUMMARY OF THE INVENTION

The present invention is made in order to solve the above conventional problems. It is an object of the present invention to provide a method of rewriting in a nonvolatile semiconductor memory device in which the absolute value of the negative voltage for use in rewrite can be set to the low value compared to the prior art and, during writing, the potential difference between the drain and the P-type well can be set to the low value compared to the prior art.

A first invention of the present invention is a method of rewriting contents in a nonvolatile semiconductor memory device, said semiconductor memory device comprises a control gate electrode, a floating gate electrode, a gate insulation film, a drain region and a source region which are formed on a semiconductor substrate, said semiconductor memory device being arranged in a P-type well electrically isolated by an N-type well, an N-type substrate or an insulation film, wherein, when the contents are rewritten by allowing a tunnel current to flow between said floating gate electrode and a diffusion layer in said drain region or a diffusion layer in said source region, (1) a first positive voltage is applied to said P-type well on the basis of an externally supplied ground potential, (2) a voltage lower than said first positive voltage is applied to said control gate electrode, and (3) a second positive voltage higher than said first positive voltage is applied to the diffusion layer which said tunnel current is allowed to flow through.

Thus, for example, the absolute value of the negative voltage applied to the control gate electrode during writing can be set to the value lower than the value of the conventional method. The potential difference between the drain and the P-type well in which the memory cell is arranged can be also set to the value lower than the value of the conventional method.

A second invention of the present invention is a method of rewriting in a nonvolatile semiconductor memory device according to the first invention, wherein said first positive voltage is an externally supplied source voltage.

Thus, for example, there is no need for an internal booster circuit and a constant voltage circuit for use in the nonvolatile semiconductor memory device. It is therefore possible to provide the nonvolatile semiconductor memory device whose size is smaller than the size of the conventional memory.

A third invention of the present invention is a method of rewriting in a nonvolatile semiconductor memory device according to the first invention, wherein, (1) when said second positive voltage is applied to said drain region, the voltage of said source region is set to a voltage between said first positive voltage and said second positive voltage and (2) when said second positive voltage is applied to said source region, the voltage of said drain region is set to a voltage between said first positive voltage and said second positive voltage.

Thus, for example, it is possible to reduce a leakage current generated during writing, whereby the booster circuit can be reduced in size. It is therefore possible to provide the nonvolatile semiconductor memory device whose size is smaller than the size of the conventional memory.

BRIEF DESCRIPTION OF THE DRAWINGS

FIG. 3 shows the voltage conditions for the elements for use in the conventional rewriting method in the nonvolatile semiconductor memory device.

DESCRIPTION OF THE REFERENCE NUMERALS

Figures 1, 2:
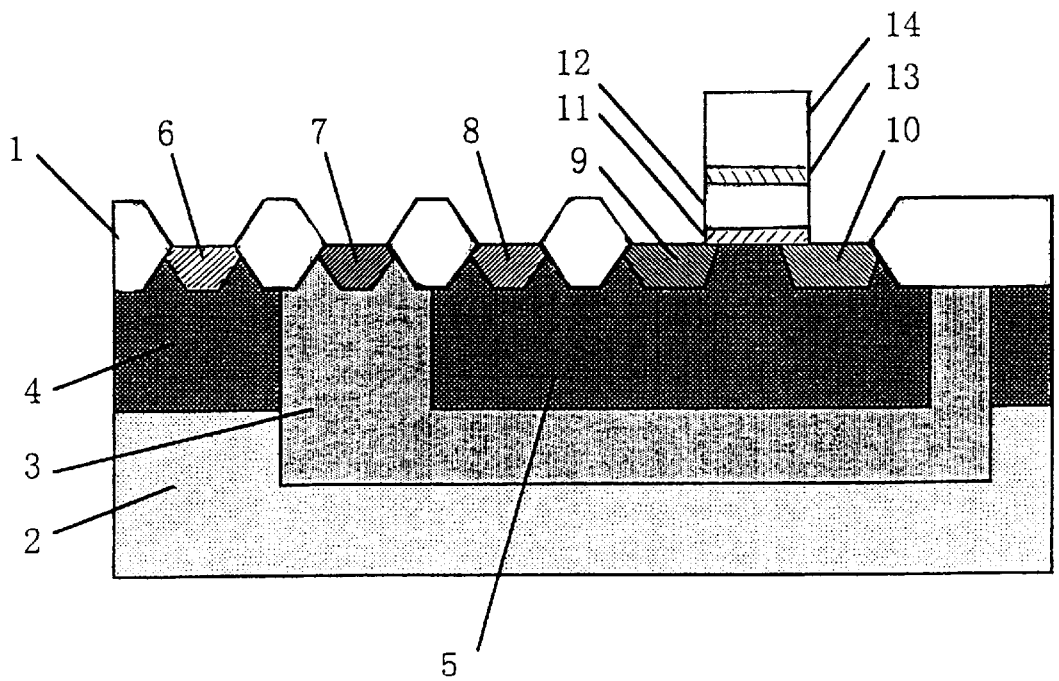
FIG. 1 shows voltage conditions for elements for use in a method of rewriting in a nonvolatile semiconductor memory device of an embodiment of the present invention.
FIG. 2 is a cross sectional view of a floating gate electrode type nonvolatile semiconductor memory device for use in "Description of the Related Art" and "Detailed Description the Preferred Embodiment"

1 Isolation
2 P-type semiconductor substrate
3 N-type well
4 First P-type well
5 Second P-type well
6 First P-type diffusion layer
7 N-type diffusion layer
8 Second P-type diffusion layer
9 Source
10 Drain
11 Gate insulation film
12 Floating gate electrode
13 Interlaminar insulation film
14 Control gate electrode

DETAILED DESCRIPTION OF THE PREFERRED EMBODIMENT

An embodiment of the present invention will be described below with reference to the accompanying drawings.

FIG. 1 shows voltage conditions for elements for use in an embodiment of a method of rewriting in a nonvolatile semiconductor memory device according to the present invention. That is, FIG. 1 shows the voltage conditions for the elements shown in FIG. 2 in the operations of a memory cell, i.e., in write, erase and read operations. In other words, FIG. 1 shows the voltage conditions for a first P-type well 4, an N-type well 3, a second P-type well 5, a control gate electrode 14, a drain 10 and a source 9 in these operations.

A constitution of the nonvolatile semiconductor memory device of this embodiment is basically the same as the constitution shown in FIG. 2 described in "Description of the Related Art". The description of the constitution is therefore omitted.

The operation of this embodiment will be described below.

First, the write operation will be described. Herein, the write is defined as the operation described below. That is, electrons in the floating gate electrode 12 are ejected from the drain 10 by a tunnel current so as to thereby reduce a threshold voltage of the memory cell.

As shown in the drawing, the voltage of the first P-type well 4 is set to 0 V (an externally supplied ground potential). The voltages of the N-type well 3 and the second P-type well 5 are set to 3.3 V. The voltage of the control gate electrode 14 is set to −6.5 V. The voltage of the drain 10 is set to 6.5 V. The voltage of the source 9 is set to 3.3 V or opened. In accordance with the above voltage conditions, a potential difference is 13 V between the control gate electrode 14 and the drain 10. In the same manner as the conventional method, a predetermined amount of tunnel current is generated between the drain 10 and the floating gate electrode 12.

The erase and read operations are performed in the same way as the prior art, and thus the description is omitted.

In this manner, a maximum voltage required for the operations is a positive potential of +6.5 V and a negative potential of −6.5 V. Compared to the positive potential of +6.5 V and the negative potential of −8.5 V in the prior art, an absolute value of a negative voltage can be set to the value 2.0 V smaller than the conventional value. In the memory cell, the potential difference between the drain 10 and the second P-type well 5 is 3.2 V in the present invention and 4.5 V in the prior art. That is, the voltage can be reduced by 1.3 V.

An effect of the capability to reduce the absolute value of the negative voltage for use in the write will be described. Consider a circuit such as an inverter having a typical structure and constituted of a combination of an N-type MOS transistor and a P-type MOS transistor. The voltage, which is actually applied between the gate and source of the MOS transistor or between the drain and the substrate, is equivalent to the potential difference between the negative voltage and a source voltage. That is, when the source voltage is 3.3 V, the applied voltage in the prior art is expressed by equation (1).

$$3.3-(-8.5)=11.8[V] \quad \text{[Equation 1]}$$

In the present invention, the applied voltage is expressed by equation (2).

$$3.3-(-6.5)=9.8[V] \quad \text{[Equation 2]}$$

In short, the prior art and the present invention require to form the highly voltage-resistant MOS transistor having the voltage resistance of 11.8 V or more and 9.8 V or more, respectively. The high voltage resistance is achieved by the use of some methods: the increase of a gate electrode length, the disposal of an offset region, the increase of a gate insulation film thickness, etc. However, these methods are inconsistent with the fine formation. On the contrary, like the present invention, in the method capable of reducing the absolute value of the negative voltage applied to the control gate electrode during writing, the gate electrode length of the highly voltage-resistant MOS transistor can be reduced compared to the conventional method.

Next, three effects are obtained by reducing the potential difference between the drain 10 and the second P-type well 5 during writing.

A first effect is the reliability of the memory cell. As the memory cell has the larger potential difference between the drain 10 and the second P-type well 5, the larger amount of hot hole current is generated due to a Band-to-Band tunnelling current in the vicinity of the drain 10. Thus, the hot hole is injected into a gate insulation film 11 of the memory cell. This hot hole deteriorates the reliability such as charge holding properties of the memory cell. The potential difference between the drain 10 and the second P-type well 5 of the memory cell can be set to the small value, whereby it is possible to prevent the injection of the hot hole into the gate insulation film 11 due to the Band-to-Band tunnelling current. Thus, the reliability of the memory cell is improved.

A second effect is low voltage operation properties. The improvement of the low voltage operation properties of the semiconductor memory device requires the reduction of the threshold voltage of the memory cell. A threshold voltage VTM of the memory cell is expressed by equation (3).

$$VTM=VTM\ (VD=0)-\alpha \times VD \quad \text{[Equation 3]}$$

VTM(VD=0) denotes the threshold voltage when a drain voltage is 0 V. VD denotes the drain voltage. α denotes a positive constant. In this manner, the increase of the drain voltage results in the reduced threshold voltage. The drain voltage applied during writing is also applied to the unselected memory cell. Thus, even if the drain voltage during writing is applied to the unselected memory cell, the unselected memory cell needs to cut off the current, that is, to have the positive threshold voltage. In short, the threshold voltage needs to be set to VTM(VD=0) as represented by equation (4).

$$VTM=VTM\ (VD=b\ 0)-\alpha \times VD \geq 0 \quad \text{[Equation 4]}$$

$$VTM\ (VD=0) \geq \alpha \times VD$$

For example, in the memory cell, the potential difference between the drain 10 and the second P-type well 5 is 3.2 V in a first embodiment of the present invention and 4.5 V in the prior art. Thus, when α=0.2 is substituted into the above expression, in the present invention, the lower limit of the threshold voltage of the memory cell is expressed by equation (5).

$$VTM\ (VD=0)=3.2 \times 0.2=0.64\ [V] \quad \text{[Equation 5]}$$

On the other hand, in the prior art, the lower limit of the threshold voltage is expressed by equation (6).

$$VTM\ (VD=0)=4.5 \times 0.2=0.90\ [V] \quad \text{[Equation 6]}$$

In short, the threshold voltage of the memory cell can be reduced by about 0.25 V in the present invention compared to the prior art. Therefore, the low voltage operation properties of the semiconductor memory device can be also improved by about 0.25 V.

A third effect is the fine formation of the memory cell. In the present invention, the memory cell has the small potential difference between the drain 10 and the second P-type well 5, and thus the resistance to drain voltage required for the memory cell can be reduced. The drain voltage resistance of the memory cell can be reduced, so that it is possible to reduce the gate length of the memory cell and also to reduce the width of a drain diffusion layer of the memory cell. Therefore, the memory cell can be finely formed.

The voltage value is just illustrative in this embodiment. Other values may be used, as long as the positive voltage can be set so that it may be applied to the P-type well which should form the memory cell. In this embodiment, the present invention is applied to the operation in which the electrons in the floating gate electrode 12 are ejected from the drain 10. Alternatively, the present invention may be applied to the operation in which the electrons in the floating gate electrode 12 are ejected from the source 9. In this example, the injection of the electrons into the floating gate electrode 12 is accomplished by the use of the tunnel current generated between the second P-type well 5 and the floating gate electrode 12. Alternatively, the injection of hot electrons from the drain 10 or the source 9 may be used. The memory cell having a stack gate type structure is used as an example. Alternatively, the present invention may be applied to the memory cell having a split gate type structure or a three-layer polysilicon type structure. The N-type well 3 is used for the electrical isolation of the second P-type well 5 from the P-type semiconductor substrate 2. Alternatively, the isolation may be accomplished by the use of an N-type epitaxial growth layer disposed on the P-type semiconductor substrate 2 or by the use of the insulation film. The insulation film may be arranged by the use of a transverse isolation in accordance with a trench isolation or a downward isolation using SOI structure.

As defined in claim 2, the source voltage is used as the positive voltage applied to the second P-type well 5, whereby there is no need for a booster circuit, a constant voltage circuit or the like. A circuit scale can be thus reduced, and consequently a small-sized nonvolatile semiconductor memory device can be realized.

As defined in claim 3, during writing, the voltage of the source 9 is set to an intermediate voltage between a first positive voltage applied to the second P-type well 5 and a second positive voltage applied to the drain 10. In this manner, the threshold voltage of the memory cell is increased by a back-bias effect, and thus a leakage current can be reduced. The leakage current can be reduced, whereby the booster circuit can be reduced in size and thus the circuit can be constituted on a small scale. As a result, the small-sized nonvolatile semiconductor memory device can be realized.

As described above, according to this embodiment, the potential of the second P-type well 5, in which the memory cell is arranged, is set to the positive voltage higher than the externally supplied ground potential. In this manner, it is possible to reduce the absolute value of the negative voltage required for the rewrite of the memory cell and applied to the control gate electrode 14. It is also possible to reduce the potential difference between the drain 10 and the second P-type well 5.

As described above, in the method of rewriting in the nonvolatile semiconductor memory device according to the present invention, the potential of the P-type well in which the memory cell is arranged is set to the positive voltage higher than the externally supplied ground potential. It is possible to reduce the absolute value of the negative voltage required for the rewrite of the memory cell and applied to the control gate electrode. It is also possible to reduce the potential difference between the drain and the P-type well in which the memory cell is arranged. Thus, it is possible to realize the nonvolatile semiconductor memory device which is finely formed, has the high reliability and can be operated at low voltage.

As can be seen from the above description, the present invention has an advantage in the capability for the fine formation compared to the prior art.

What is claimed is:

1. A method of rewriting in a nonvolatile semiconductor memory device, said semiconductor memory device comprising a control gate, a floating gate, a gate insulation film, a drain region and a source region which are formed on a semiconductor substrate, and are arranged in a P-type well electrically isolated from said semiconductor substrate, wherein, when the contents are rewritten by allowing a tunnel current to flow between said floating gate electrode and one of a diffusion layer in said drain region and a diffusion layer in said source region, (1) a first positive voltage is applied to said P-type well on the basis of an externally supplied ground potential, (2) a voltage lower than said first positive voltage is applied to said control gate electrode, and (3) a second positive voltage higher than said first positive voltage is applied to said one of said diffusion layer in said drain region and said diffusion layer in said source region which said tunnel current is allowed to flow through.

2. The method of rewriting in a nonvolatile semiconductor memory device according to claim 1, wherein said first positive voltage is an externally supplied source voltage.

3. The method of rewriting in a nonvolatile semiconductor memory device according to claim 1, wherein, (1) when said second positive voltage is applied to said drain region, the voltage of said source region is set to a voltage between said first positive voltage and said second positive voltage and (2) when said second positive voltage is applied to said source region, the voltage of said drain region is set to a voltage between said first positive voltage and said second positive voltage.

* * * * *